United States Patent [19]

Wang

[11] Patent Number: 4,852,094

[45] Date of Patent: Jul. 25, 1989

[54] DUAL PATH SWITCH GATE ARRAY

[75] Inventor: Chung-Tao D. Wang, Melville, N.Y.

[73] Assignee: Eaton Corporation, Cleveland, Ohio

[21] Appl. No.: 119,363

[22] Filed: Nov. 10, 1987

[51] Int. Cl.⁴ ............................................. G01R 31/28
[52] U.S. Cl. ...................................................... 371/24
[58] Field of Search .......................... 371/24, 25, 21, 71

[56] References Cited

U.S. PATENT DOCUMENTS

| | | | |
|---|---|---|---|
| 3,633,016 | 1/1972 | Walker et al. | 371/24 |
| 3,961,252 | 6/1976 | Eichelberger | 371/21 |
| 4,667,330 | 5/1987 | Kumagai | 371/71 |
| 4,750,181 | 6/1988 | McDonald et al. | 371/71 |

OTHER PUBLICATIONS

Sellers, Jr. et al., Error Detecting Logic for Digital Computers, McGraw-Hill Book Co., New York, 1968, pp. 254-255.

Primary Examiner—Charles E. Atkinson
Attorney, Agent, or Firm—Andrus, Sceales, Starke & Sawall

[57] ABSTRACT

A dual path switch (DPS) circuit for interfacing between arithmetic elements of a computer for performing Fast Fourier Transforms. The ratio of power consumption to signal resolution is very low. The DPS has very high frequency resolution, and to conserve power, many of its registers are reset to a logic low status when they are not in use. The DPS includes a diagnostic system which, upon a hardware failure, identifies the faulty gate and specifies the nature of the fault. The diagnostic system also provides a fault signal for use in testing for the mean time between failures.

15 Claims, 8 Drawing Sheets

| FAULT TYPE | OUTPUT (C0-C7) | ERROR (E0-E7) |
|---|---|---|
| 1. NO ERROR | CODE | ZERO |
| 2. STUCK-AT-0 AT THE nth FLIP-FLOP | ZERO AFTER THE nth BIT | CODE |
| 3. STUCK-AT-1 AT THE nth FLIP-FLOP | ZERO TO ONE TRANSITION AT THE nth BIT | ONE'S COMPLEMENT OF THE CODE |
| 4. OPEN CIRCUIT | ALL ONE'S | ONE'S COMPLEMENT OF THE CODE |
| 5. SHORT CIRCUIT | RANDOM PATTERNS ON MORE THAN ONE CHANNEL | RANDOM PATTERNS ON MORE THAN ONE CHANNEL |

FIG. 6

|  | PRIOR ART I | THIS INVENTION |
|---|---|---|
| POWER DISSIPATION (WATTS) | 20 | 20 |
| NO. OF SAMPLES (N) | 1,024 | 65,536 |
| SAMPLING RATE (Fs) | 400 kHz | 2 MHz |
| FFT PROCESSING TIME (T) | 2 mSEC | 32 mSEC |
| THROUGHPUT ($\frac{N}{T}$ SAMPLES/$\mu$SEC) | 0.5 | 2 |
| SIGNAL BW/WATT | 10 kHz/WATT | 50 kHz/WATT |
| FREQUENCY RESOLUTION | 390 Hz | 30.5 Hz |
| DYNAMIC RANGE | 16 BIT FIXED POINT | 32 BIT FLOATING POINT |

FIG. 7

|  | PRIOR ART 2 | THIS INVENTION |
|---|---|---|
| POWER DISSIPATION (WATTS) | 600 | 20 |
| NO. OF SAMPLES (N) | 65,536 | 65,536 |
| SAMPLING RATE ($F_S$) | 5.6 MHz | 2 MHz |
| FFT PROCESSING TIME (T) | 11.7 mSEC | 32 mSEC |
| THROUGHPUT ($\frac{N}{T}$ SAMPLES/$\mu$SEC) | 5.6 | 2 |
| SIGNAL BW/WATT | 4.6 kHz/WATT | 50 kHz/WATT |
| FREQUENCY RESOLUTION | 85.5 Hz | 30.5 Hz |
| DYNAMIC RANGE | 21 BIT BLOCK FLOATING POINT | 32 BIT FLOATING POINT |

FIG. 8

DUAL PATH SWITCH GATE ARRAY

BACKGROUND OF THE INVENTION

The field of the invention is computers for circulating Fast Fourier Transforms (FFTs), and in particular those for which power dissipation must be unusually low and both resolution and reliability unusually high. The FFT is one of the most commonly used algorithms for spectral analysis, emitter identification, digital filtering and signal reconstruction. Apparatus for performing the FFT process includes memories, delay registers, arithmetic elements, "dual path switches" used as interfaces between arithmetic elements, etc.

"Dual path switches" (DPSs) are an important part of the present invention. They are multiplexers or sets of selector switches that steer digitized signals to one channel or another, with appropriate cycle delays. DPSs are used in many electronic warfare, communications, and electronics intelligence systems.

Many DPS interfaces are used in an FFT processor, as can be shown by a 1024-sample FFT circuit, which is sometimes referred to in this field as a "benchmark". The benchmark's processor may be composed of 10 processing stages ($1024=2^{10}$). Where a 32-bit data format is employed, each stage requires two words of 32-bit data apiece, i.e., 32 bits for in-phase data and 32 bits for quadrature-phase data. Four 8-bit DPSs are required to implement each 32 bit word, hence 8 DPSs are required per stage. As a result, 80 DPSs are required for a 10-stage FFT benchmark of that type.

The receiving apparatus for a multiple channel phased antenna array, for example a 16 channel system, may have more than 1,280 DPSs. The improvement in size, power, processing throughput, and reliability of such a large system can be very great when a smaller, faster, and more reliable DPS gate array of lower power consumption is employed.

SUMMARY OF THE INVENTION

An object of the invention is to provide a very small and compact DPS that requires very little power, for use in an FFT algorithm computer.

Another object is to provide a DPS for an FFT computer in which the ratio of throughput rate (samples per microsecond) to power consumption is high.

Another object is to provide a DPS for an FFT computer in which the ratio of signal bandwidth to power consumption to power consumption is very high and the frequency resolution is very fine.

Another object is to provide an on-chip fault diagnostic system for the DPS portion of an FFT computer, which identifies a defective gate.

Another object is to provide a fault diagnostic system for the DPS portion of an FFT computer, which specifies the fault as being one of several types.

Another object is to provide an on-chip fault signal circuit for use in externally measuring the time between failures of the DPS.

Another object is to provide a DPS that can be used in different applications or roles, each DPS having multiple-stage registers, and wherein the stages that are not utilized in a particular application are placed in a logic low state, to conserve power.

DETAILED DESCRIPTION OF PREFERRED EMBODIMENT

Overview

The system shown and described herein is the preferred embodiment of the invention. It is for a radix 2 FFT algorithm that has a normal (not bit-reversed) input data sequence, decimation in time, decreasing order of buffer size distribution, and a bit-reversed output sequence, and is usable for both forward and inverse FFT analysis. However, this embodiment is intended as only one example of the invention; numerous variations may be employed within the concepts of the invention as claimed.

The FFT algorithm employed herein is described by L. R. Rabiner and B. Gold in Chapter 10, and especially on pages 604–609, of their book "Theory and Application of Digital Signal Processing", Prentice-Hall, Inc., Englewood Cliffs, N.J., 1975.

The 16-benchmark linear systolic array processor of which the described invention embodiment is a part comprises an analog to digital converter (A/D), followed by sixteen benchmark processors in cascade, followed by a digital to analog converter (D/A). The 16-benchmark system can perform a 65,636-sample FFT in 32 milliseconds, when operating at a clock rate of 1 MHz. The expected power dissipation of the benchmark portion of the sixteen-benchmark apparatus at that clock rate is approximately 12 watts.

The power dissipation of the CMOS chip comprising the computation modules (which include the DPS invention) is directly proportional to the speed at which it is operated. A feature of the described apparatus is to employ a chip design that is capable of being operated at a clock frequency of 10 MHz, but to operate it at a clock frequency of only 1 MHz to reduce the power dissipation. The low clock rate might be expected to result in an FFT processor of greatly reduce throughput as compared with the prior art, but it does not. The low clock rate is more than compensated by performing a tremendous number of computations in parallel, so the throughput of the equipment is in fact significantly increased, and the power consumption is extremely low because of the way that the circuit elements are utilized.

A basic computation module of the FFT processor includes DPSs and arithmetic elements. The DPSs provide necessary interfacing, including appropriate delays, between two computation modules, and are described in detail below. The arithmetic elements are not part of the present invention and are well known, so description of them is provided here only to the brief extent necessary to show the environment. The arithmetic elements consist of two buffer memories, four multipliers (floating point) and six adders, for performing the radix-2 decimation-in-time computation operation. Many operations are performed in parallel. The arithmetic operations are pipelined to achieve minimum computational overhead.

In fabricating the computer, two-micron CMOS VLSI logic was used. The VLSI electronic diagrams would be so detailed and cumbersome if all of them were shown as gate-level diagrams that some block diagrams are employed instead, but only where the subcircuits within the blocks are conventional and their functions are clear. The VLSI implementation employs logic circuits like those of smaller scale integrated circuit chips that are manufactured and sold commercially by International Microcircuits, Inc., of 3350 Scott Blvd., Building 36, Santa Clara, Calif., 95054. For convenience the figures herein employ some of the model numbers of smaller scale conventional circuits that are the same as the circuits on the VLSI chip of this preferred embodiment. Details of these standard circuits, are not necessary for an understanding of the the invention, are published by International Microcircuits, Inc. in their "Microcell Data Book", number IMI 6000, 1985.

The preferred embodiment is fabricated in a 64 pin ceramic dual-in-line package that can accommodate 6000 gates. The array being described has 4300 gates. Nineteen of the 64 pins of its dual-in-line package are used as test points for various testing functions. The master clock rate is 1 MHz, and the word length is 32 bits. The DPS array system uses an 8192 by 32 bit static RAM; it has two 2-to-1 multiplexers (switches) per computation module, and two 32K by 32 bit ROM memories. The ROMs, which are sometimes referred to as "twiddle factor" memories, store the coefficients that are necessary for performing the Fourier transform.

This paragraph and the next two describe a very important aspect of the invention, namely the manner in which the apparatus is tailored to the FFT algorithm that it implements, to keep almost all devices busy at almost all times, or to turn them off. Prior FFT equipment that operates at a much higher clock frequency has a great amount of idle time and inefficient operation of many of its devices, because its architecture is not tailored to the algorithm that it is executing.

Figure 1:
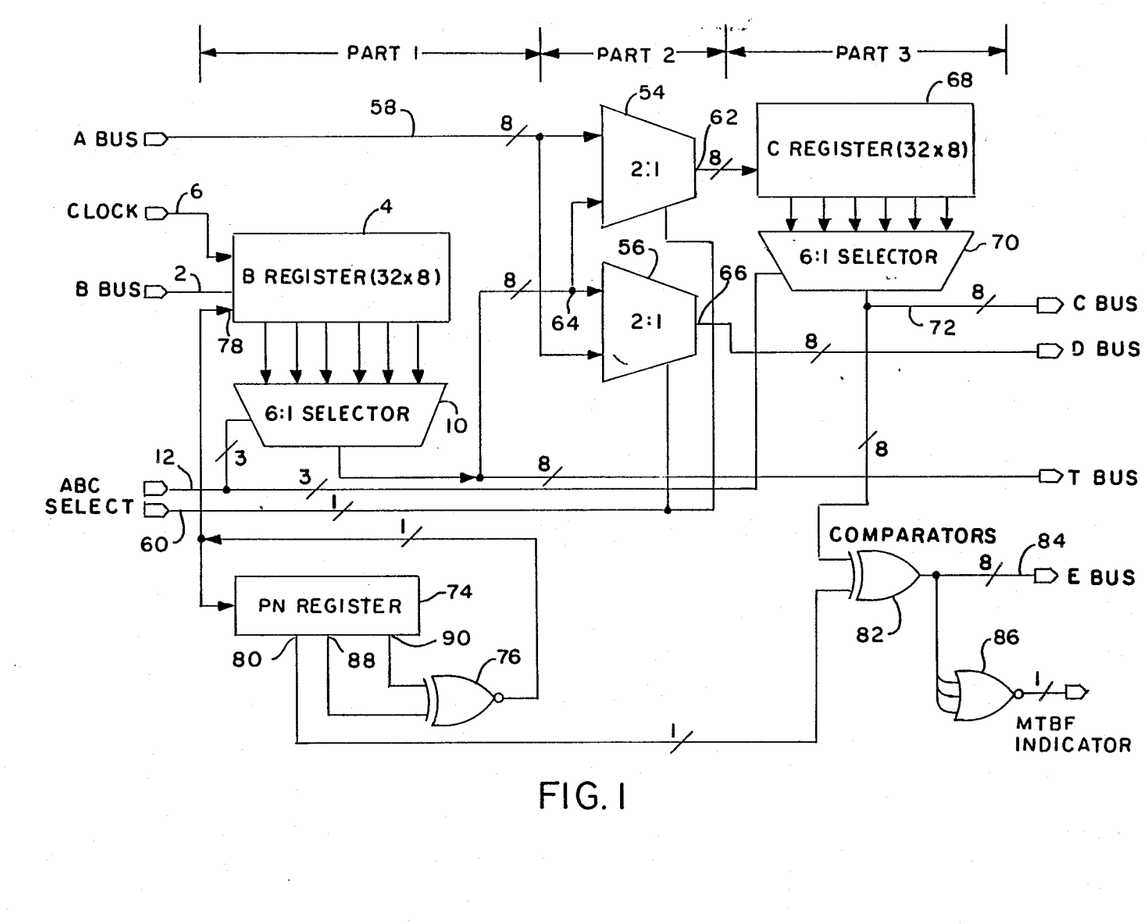
FIG. 1 is a block diagram of a DPS portion of the computation module and of a self-testing diagnostic system for the DPS, for use in an FFT computer.

As shown in FIG. 1, the DPSs or buffer memory switches for the computation module include variable-length shift registers (B and C) and switches. A multiplexer is sandwiched between two delay registers, hence the upper portion of FIG. 1 is divisible into three principal parts as marked at the top of the figure. Each of parts 1 and 3 includes a 32-by-8 bit shift register, where 32 is the file length. Additional modules are used to achieve 32-by-16 bit capability. Each 32 bit shift register is tapped for output at six places to provide selectable delays in binary increments, i.e., delays of 1, 2, 4, 8, 16, or 32 cycles. Three bits of control signal, at a bus ABC, select the desired delay.

Part 2 of FIG. 1 is a pair of two-to-one multiplexers, which are the dual path switches, or DPSs. They provide two possible routing patterns for the two input data channels from A bus and B bus to C bus and D bus, as described in more detail below. The two routing patterns are dynamically controlled by a SELECT signal, which is timed to ensure the necessary delays for the FFT algorithm.

The same type of module is used in all stages of the FFT. They are critical parameters for proper execution of the FFT algorithm. The delay length and switch rate are set differently for different stages of the FFT equipment.

The B Register

FIG. 1 shows a B bus terminal 2 for receiving data from an analog to digital converter (A/D), not shown. A set of the data from the B bus are conducted to a B register 4. The B register 4 accepts eight bits in parallel upon occurrence of a clock pulse at a clock terminal 6. For a 16 bit word two sets of the equipment of FIG. 1 are required, etc. The clock pulses occur at 1 microsecond intervals; a new set of data is clocked into the register 4 upon each clock cycle. As is usual in a shift register, the data move from one stage to the next successive stage upon each clock cycle. Register 4 is 32 stages long.

Figure 2:
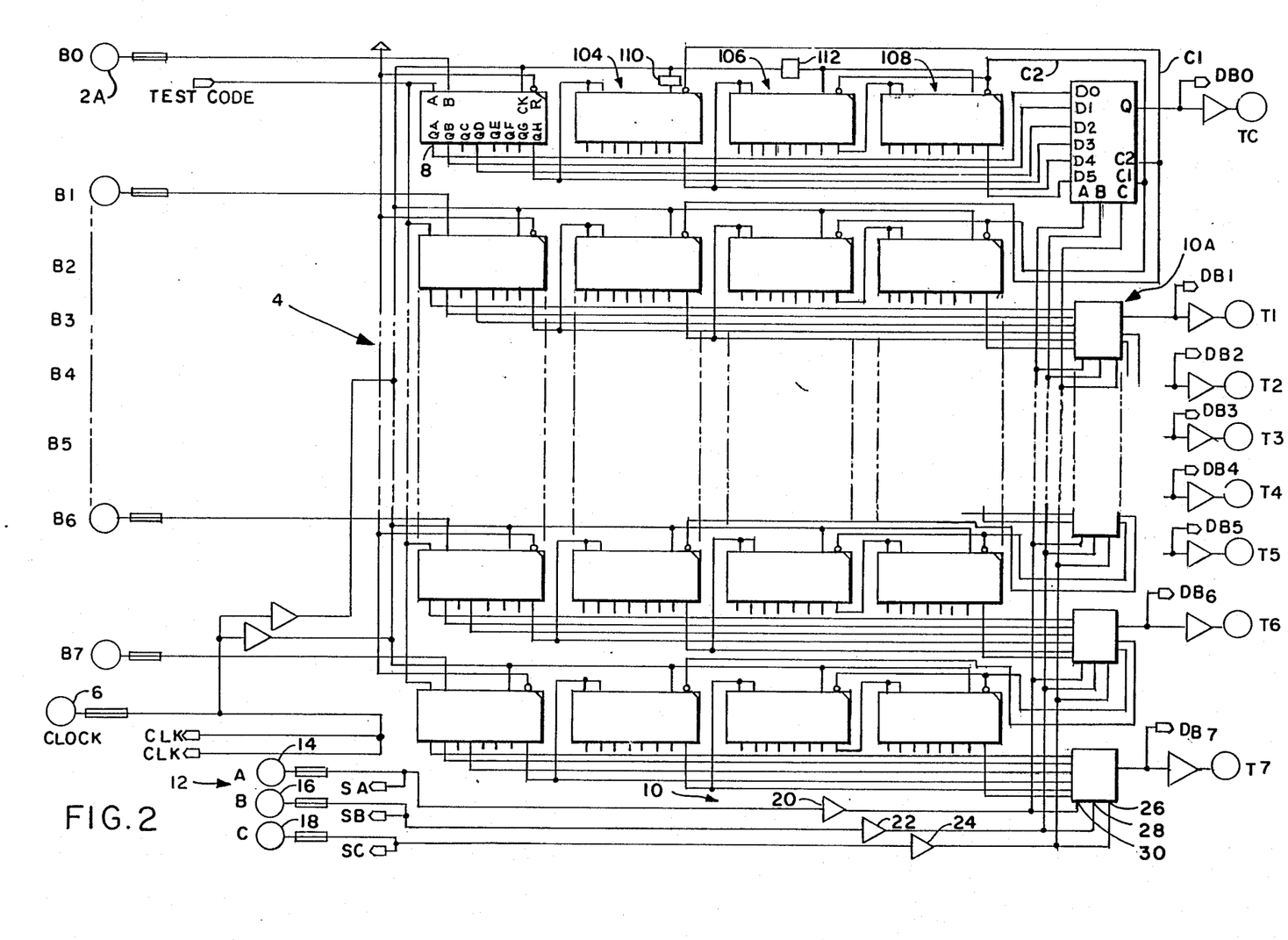
FIG. 2 is a block diagram of B registers (delays) and of a 6:1 delay selector circuit of the VLSI embodiment of the invention.

Details of register 4 are shown in FIG. 2. Equipment for only a few of the subcircuits is shown because of replication of subcircuits. Terminal 2A of FIG. 2 is one of the 32 terminals represented by the B bus 2 of FIG. 1. Data are input to the B register 4 in series and read out in parallel; that is, the data of 32 clock cycles are read into register 4 during any 32-count time interval. The contents of all 32 shift register stages for any particular digit stand in pipeline file at the output terminals 8 of each row of registers.

Although the B register 4 is capable of 32 cycles of delay, it has output taps at delays of 1, 2, 4, 8, 16 and 32 cycles. The length of the delay that it provides must be different for DPSs in different portions of the computation apparatus. Although DPSs of the same design are used throughout, the appropriate delay of the shift register 4 is selected in each case by a 6:1 delay selector 10.

6:1 Delay Selector

Figure 3:
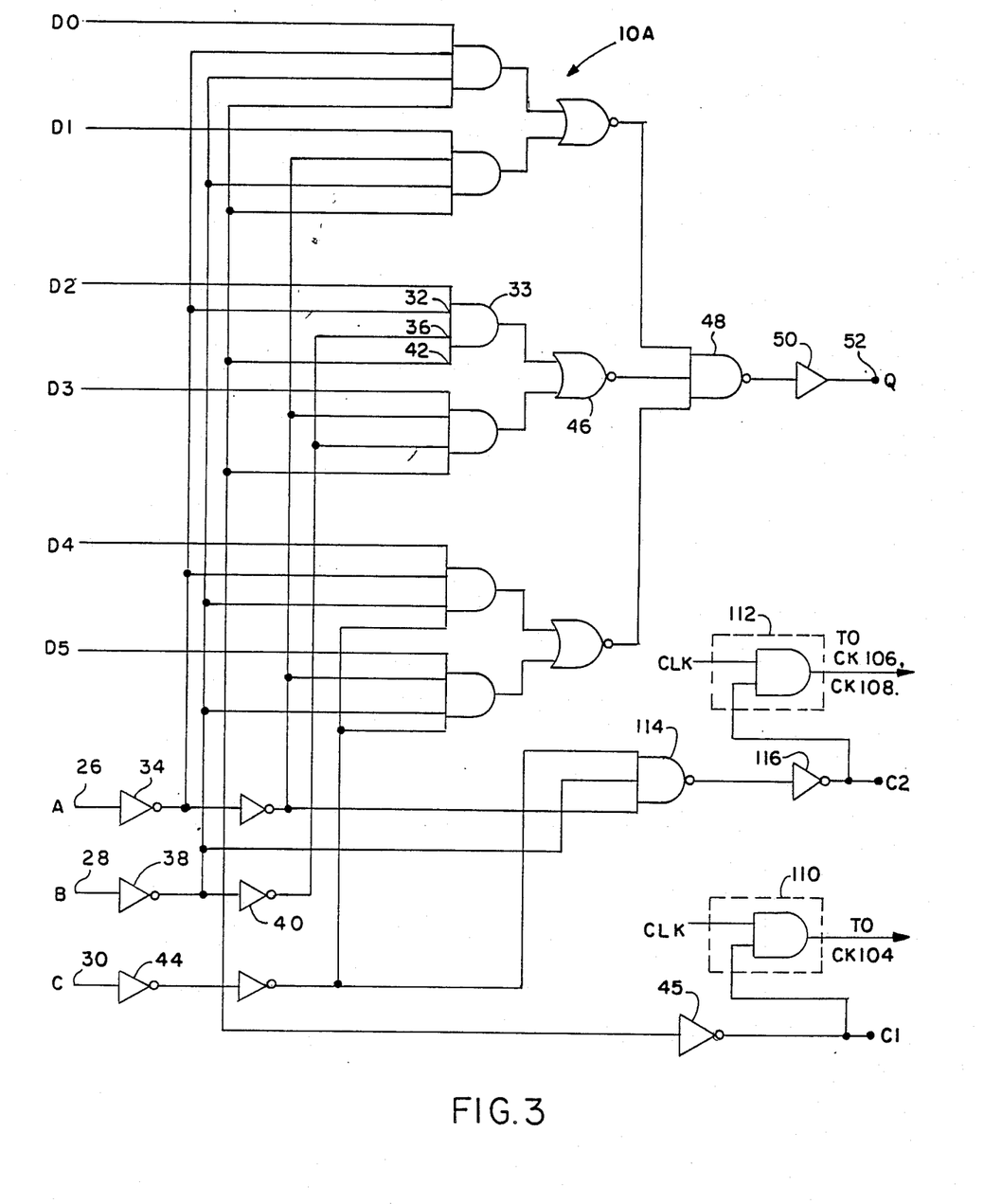
FIG. 3 is a gate-level schematic diagram of the 6:1 delay selector, including circuits for putting unused registers in a reset state.

The Delay Selector 10 is represented in block form on FIG. 1, again in block form on FIG. 2, where its interconnections with other circuit elements are shown, and as a gate level diagram in FIG. 3. The selector 10 is controlled by three bit commands at the ABC bus 12 of FIG. 1. On FIG. 2 the A, B, C terminals are shown separately and indicated by reference numerals 14, 16 and 18. Their control signals are connected through buffer amplifiers 20, 22, 24 of FIG. 2, all of which are portions of the selector 10, to eight subcircuits 10A, which are also portions of the selector 10. Subcircuits 10A are in a column at the right of FIG. 2.

In FIG. 3 logic details of the subcircuit 10A are shown. Its A, B, C input terminals 26, 28 and 30 receive signals from the outputs of buffer amplifiers 20, 22 and 24, respectively. Other inputs to the selector 10A are six data lines D0 through D5, each of which comes from a data output terminal of the B shift register 4 with a different delay.

To select data of stage D2, for example, a logic low signal is placed on the A terminal 26, which, because of an inverter 34, results in a high at terminal 32 of an AND gate 33. A logic high is set at terminal 36, as a result of a high signal at B terminal 28 and inversions by amplifiers 38 and 40. A logic high stands at another input 42 of the AND gate 33 as a result of a low signal at C terminal 30, which is inverted in inverter 44. The data of terminal D2 passes through AND gate 33 and an inverting OR gate 46, a NAND gate 48 and a buffer amplifier 50. The output of 50 is connected to a Q output terminal 52. Under the conditions of the example, the data at 52 equal the data at D2.

As shown in FIG. 3, another output of the circuit 10A is at a terminal C1. Its signals are a copy of those at C terminal 30, because of having been inverted in amplifiers 44 and 45. The output terminal C1 of FIG. 3 is connected to the clear (reset) terminals R of registers in the column 104, FIG. 2, to put them in zero state because they are not to be used.

The selection signals A, B, C, with B inverted, are input to a NAND gate 114, which is followed by an inverter 116 and a terminal C2. The output at C2 is connected to the clear terminal R of shift registers in both columns 106 and 108, FIG. 2. When a computation module is employed for an amount of delay that does not require registers 106 and 108, they placed in a logic zero or low state, to conserve power. Of course all of the registers in the column under register 104 are cleared by C1 when 104 is cleared, and all of those in the columns under registers 106 and 108 are cleared by C2 when 106 and 108 are cleared. Congestion on the drawing prevents showing all of the connections individually.

Setting by ABC signals is done once for all when a register is assigned to a role in which it must provide a particular amount of delay; the delays are not dynamically programed.

An extension of the power conservation concept is to block the clock signals to unused registers. This can be accomplished in any of several ways, for example as shown in FIG. 3. When signals A, B, and C are such that C2 is clearing the registers 106 and 108, C2 also controls a gate 112. This interdicts the clock signal that would otherwise go to terminals CK of all registers in the 106 and 108 columns. If C1 holds the registers 104 in a cleared state, it also disables a gate 110 to block the clock signals of registers in column 104, FIG. 2. As before, only exemplary connections are shown on FIG. 2.

The 2:1 Switches

Output data from the 6:1 delay selectors 10 are connected to both of the 2:1 selector switch groups 54, 56 as shown at 64 on FIG. 1. Also connected to both of the switch groups 54, 56 are the data at 58 from the A bus. Of the input signals at the A bus and B bus, one set is delayed with respect to the other in accordance with the dictates of the FFT algorithm being performed.

The switches 54, 56 are controlled by a one-bit "select" command signal received at a terminal 60. When the select signal is low, straight paths are chosen from A bus 58 through switches 54 to output terminals 62 of switches 54 and from input terminals 64 of switches 56 to output terminals 66 of switches 56. When the select signal is high, the cross paths are chosen, with terminals 58 being connected through switches 56 to terminals 66 and data at terminals 64 being connected through switches 54 to terminals 62.

Figure 4:
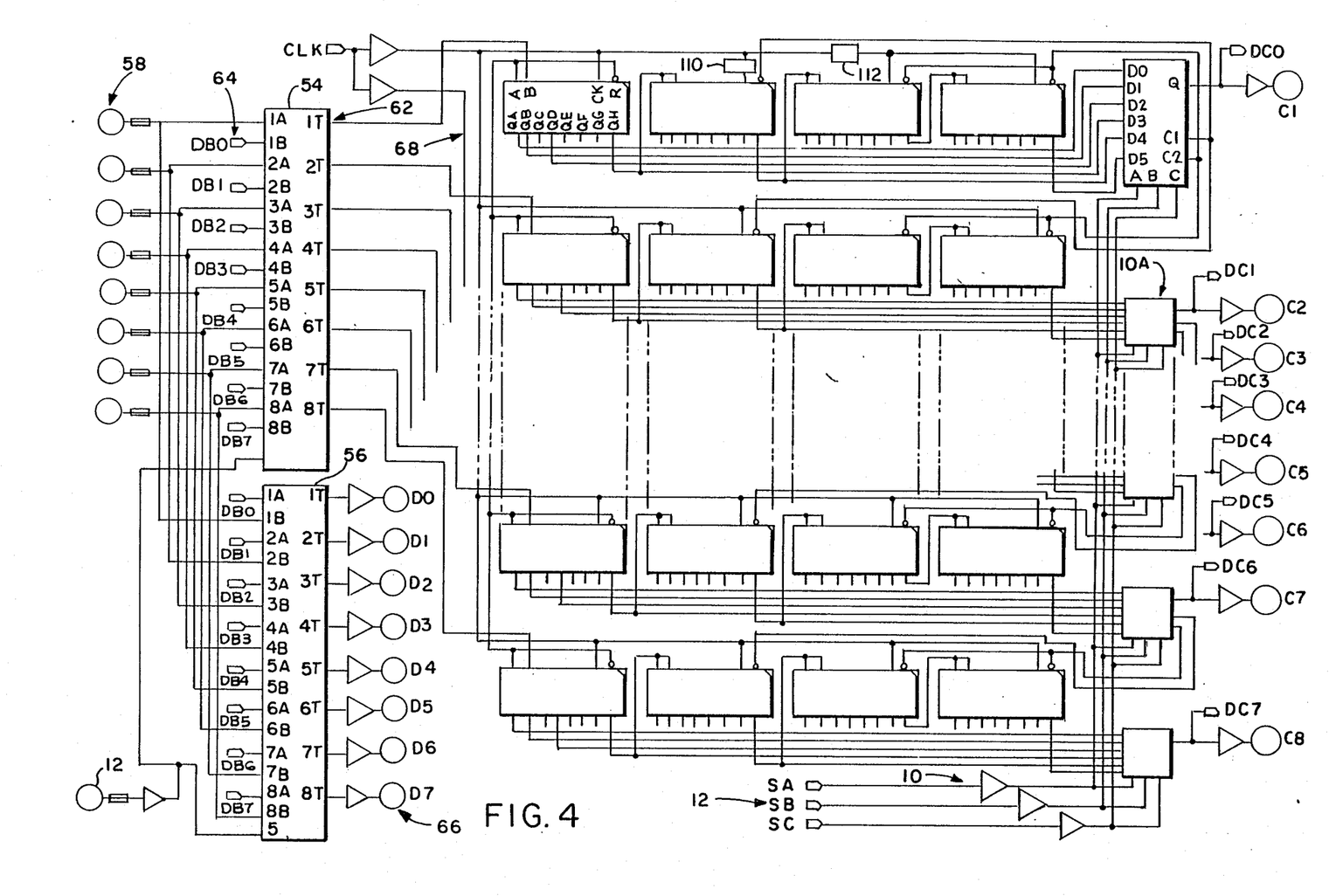
FIG. 4 is a block diagram showing 2:1 multiplexer switches and C registers (delays) of the invented DPS.

FIG. 4 shows more details of the switching circuits. As shown there, terminals A0 through A7 represent the eight individual data lines of A bus at terminals 58. Connections are made from those eight terminals to the 1A, 2A, etc., input terminals of switches 54. When the select terminal 12 has a low signal, connections are made to output terminals 1Y to 8Y of switches 54. These are the terminals that are shown as a bus by reference numeral 62 on FIG. 1. Data are conducted from these terminals to the input terminals of the C register 68. This is a shift register of identical design to that of the B register 4, which was described above.

When the select signal at terminal 12 is high, the switches 54 make connections from their terminals DB0 through DB7 of FIG. 4, which represent the individual terminals of the bus 64, to the bus 62 of switches 54 so that data from the 6:1 selector 10 are connected to the C register 68.

In a similar manner the switches 56 connect data from the 6:1 selector 10's bus 64 to the D bus 66 when the select signal at terminal 12 is low, and from the A bus 58 to the D bus 66 when the select signal is high. The D bus 66 is shown as individual terminals D0 to D7 on FIG. 4.

The output data of the 6:1 selector 10 are connected also to terminals of a T bus, FIG. 1.

The C Register and Its Delay Selector

The C register 68 and its associated output register 70 function as described above in connection with the B register 4 and its selector 10 to transmit data with a selectable delay to the C bus. This bus is denoted by reference numeral 72 on FIG. 1, and its individual terminals are shown on FIG. 4 as terminals C0 to C7.

Self-Diagnostic Circuit

The DPS is equipped with an on-chip self-diagnostic tester. It can generate a pseudorandom (PN) signal sequence for input to the DPS, and compare the resulting DPS output to the delayed PN signal sequence. The diagnostic circuit can isolate device failures to the faulty flip-flop level. From the error patterns, one can identify stuck-at-zero, stuck-at-one, open-circuited, and short-circuited types of hardware failures. The on-chip PN register 74 and the output pattern comparators 82 at the bottom of FIG. 1 perform these functions. More details are shown on FIG. 5.

The functional operation of the self-diagnostic circuit will be described first, then the apparatus that accomplishes the functions will be described in detail.

Figure 5:
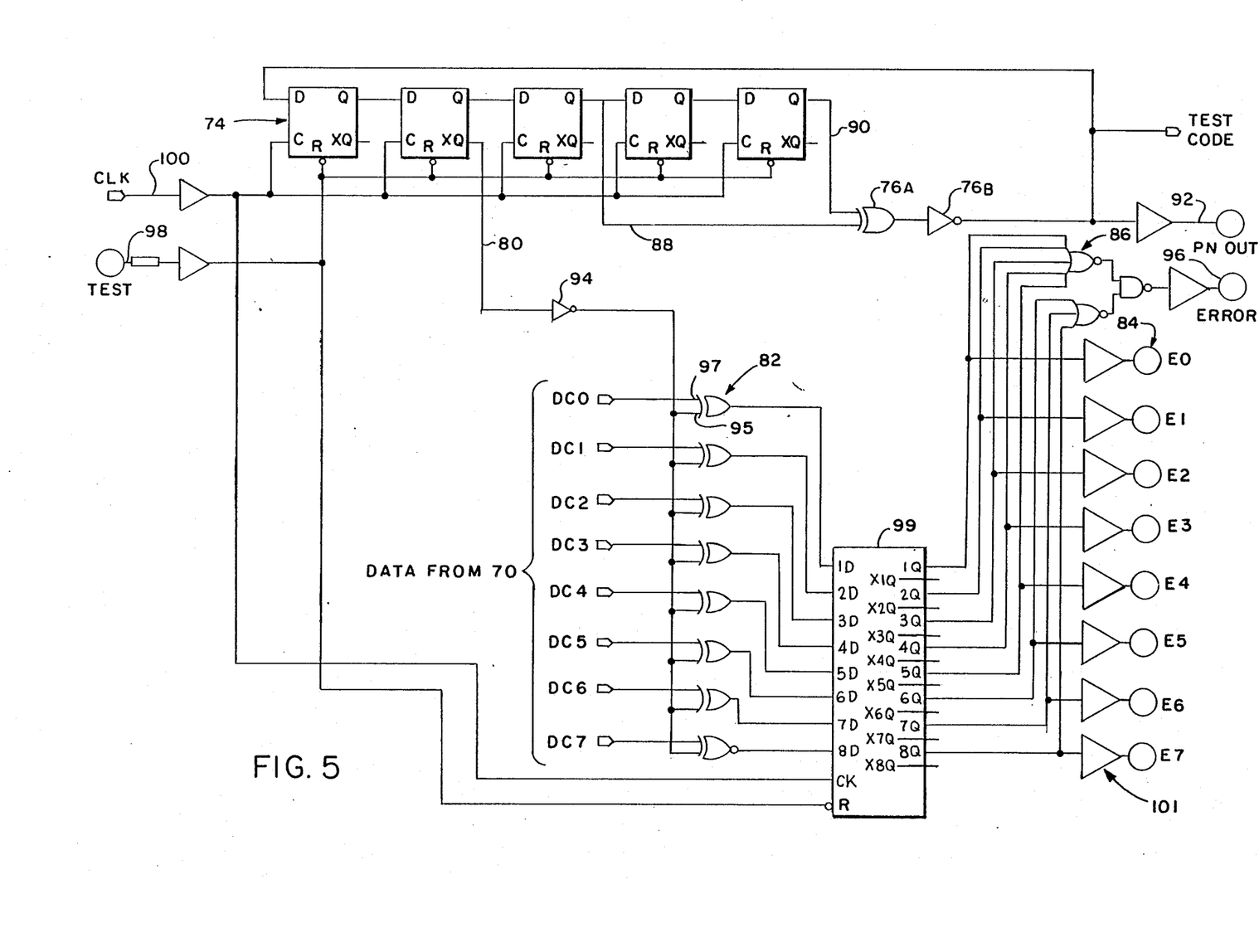
FIG. 5 is a block diagram of the self-diagnostic PN code device and fault comparators of the DPS.

To perform a diagnostic test, the five-bit PN register 74, which is a code generator, is turned on (by changing the signal of a TEST pin 98 of FIG. 5 from zero to one). The generator 74 produces a PN test code with a period of 31 bits as follows: 11100, 10001, 01011, 11011, 01001, 10000, 1.

The PN code from generator 74 is clocked into the B register at terminal 78, FIG. 1. It passes through the 6:1 selector 10. The SELECT pin 60 is also set to high, so that the cross paths of the switches 54 are chosen, in order to pass the PN code to the C register 68 and through the 6:1 selector 70 to the C bus 72. This output is compared in a comparator 82 with the code sequence that went in originally at terminal 78 of the B register.

The total length of the two registers B and C is 64 and the PN code generator 74 is only 31 counts long, (two iterations are 62 counts long), so the PN code must be delayed by two counts before it is compared with the output from the C bus 72. The code signal is then in phase with the output at terminal 72 as shown on FIG. 1. The comparison is performed in comparators 82 for all bits of the C bus data.

Because the PN code repeats itself only each 31 bits, a form of commutation occurs for fault isolation purposes. Any deviation (detected by the comparators 82) of the C bus signals from the original PN code, is defined as a fault, and is manifested as an output at the E bus 84.

Figure 6:
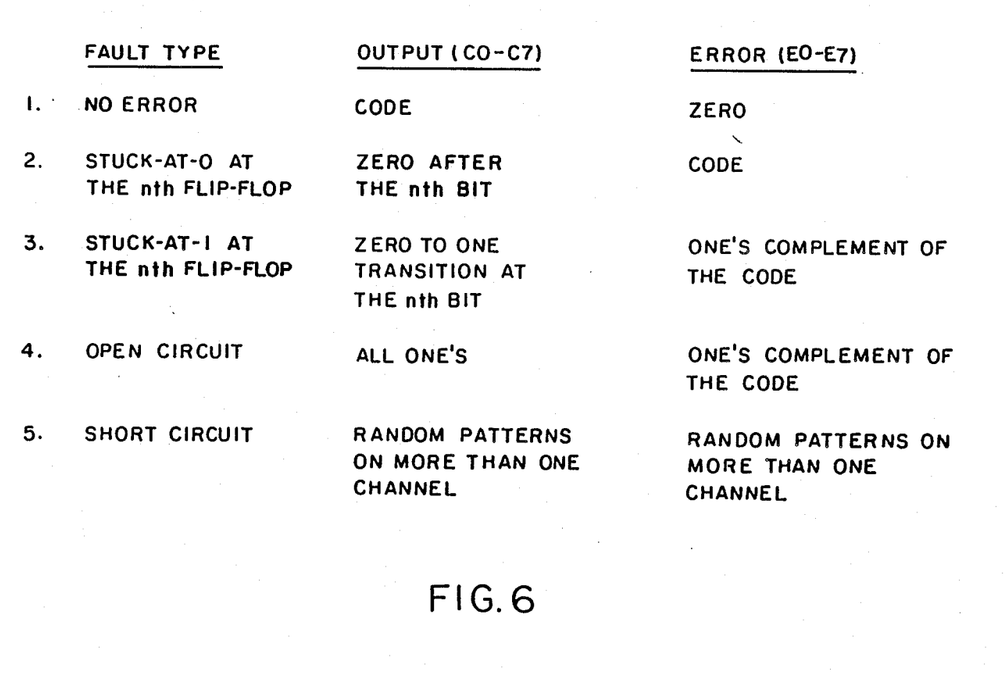
FIG. 6 is a table summarizing fault patterns detectable by the self-diagnostic circuit of the DPS.

Moreover, by another comparison, namely of the C bus output at 72 with the comparator's E bus output at 84, a fault can also be uniquely isolated to the faulty flip-flop. The various types of faults that can be distinguished by the diagnostic circuit are: stuck-at-1 (permanently high); stuck-at-0 (permanently low); open-circuit (broken connection); short-circuit (two or more conductors shorted). FIG. 6 is a summary of all fault patterns, showing how the C bus outputs and E bus outputs together disclose the nature of the fault.

The apparatus for performing these functions is as follows. FIG. 1 shows the PN register 74, which generates the code signal for diagnostic testing of the other circuit portions of FIG. 1. The code that is output by register 74 is controlled by feedback through an exclusive NOR gate 76. The output of gate 76 is fed back to a data input of the PN register 74 and is connected also to the B register 4 at a terminal 78.

On FIG. 5 where the PN register 74 is seen to be a five-stage shift register. The outputs 88, 90 from the third and fifth stages respectively are connected to an exclusive OR gate 76a, whose output is connected to an inverter 76b. The elements 76a and 76b form the exclusive NOR gate 76.

The PN register 74 also has an output terminal 80 from which a one-bit signal is conducted to one input of comparators 82. The output from the negated signal terminal 80 is inverted by an amplifier 94 (FIG. 5), and applied to one of the two input terminals 95 of each of the eight exclusive OR gates 82.

The other input 97 of each of the gates 82 receives one of the eight digits of the output data from the 6:1 selector 70, FIG. 1. When the signals match at the two inputs 95, 97 of a gate 82, the output of the gate is low.

The block 99 of FIG. 5, to which the outputs of comparators 82 are connected, is merely a register. It receives the eight comparators' output signals with some time variations, and outputs all of them at the same time to amplifiers 101 that feed the E bus (error bus), 84. The E bus 84 shows a pattern of error signals comprising eight digits at its individual terminals E0 to E7, FIG. 5.

As shown in FIG. 6, when no error is present during a self-diagnostic test, the 31-bit PN code of the tester appears at the output terminals C0-7, and logic low signals appear at all of the error output terminals E0-E7. When the Nth flip flop of the 64 flip flops in the test chain (i.e., the B register 4 and the C register 68 is at 0 and not changing, the output of the terminals C0-C7 becomes a logic low after the Nth bit and the error output at terminals E0-E7 becomes the 31-bit code.

When the output of the Nth flip-flop has a fault in which it remains at logic one, the terminals C0-C7 change from a logic low to a logic high at the Nth bit, and the error bus has a ONE's complement of the PN code. When a stage of the registers being tested has an open circuit, the output C0-C7 is all one's and the output E0-E7 is the ONE's complement of the PN code.

When the fault type is a short circuit on one or more of the B or C shift register stages, random patterns appear on more than one channel of the output C0-C7, and random patterns appear also on more than one channel of the error bus E0-E7. The patterns of FIG. 6 enable identification of a faulty register stage and, within limits, show the type of fault.

MTBF Signal

A go/no-go circuit is also provided to facilitate mean-time-between-failure testing; it issues a signal whenever a fault of any type occurs at any bit. The error codes are connected to NOR gates 86 which produce a one-bit output signal at an error terminal 96. That signal merely indicates when any type of error occurs in any digit or any stage. An external counter can be connected to terminal 99 if desired to take data regarding the mean time between failures; for example, the number of faults occurring in a week of testing can be determined.

A test signal terminal 98, FIG. 5, is provided for clearing the diagnostic registers, and a clock terminal 100 is provided for clocking the registers.

The diagnostic circuits occupies only two percent of the chip. During the design and simulation of a gate array, the self-diagnostic capability is useful for locating faults due to human errors such as inadvertent grounding of outputs and broken connections. The self-test feature shortens the development of a new application of the DPS.

Comparisons With Prior Art

Figure 7:
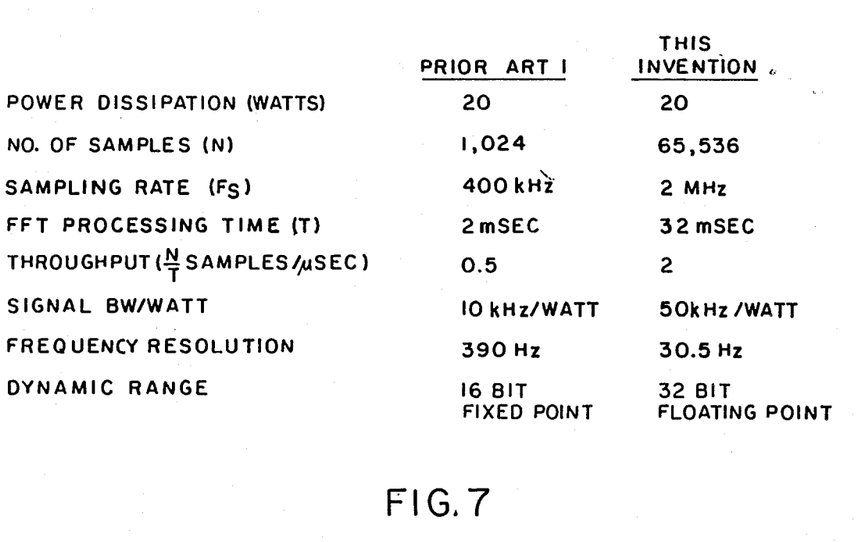
FIG. 7 is a table comparing significant performance characteristics of an FFT employing the invention with those of one FFT of the prior art that consumes the same power.

In FIG. 7, an array process constructed with the invention is compared with one array processor of the prior art. For equal power dissipation of 20 watts in the invented device and in the prior art device, the number of samples in one benchmark of the invention is 65,536 and it is 1,024 in the prior art. The sampling rate with the invention is 2 MHz, and with the prior art is 400 KHz.

The FFT processing time with the invention is 32 mSec and with the prior art it is 2 mSec. The throughput rate for the invention is two samples per microsecond, and with the prior art one half sample per microsecond. The signal bandwidth per watt with the invention is 50 KHz per watt, and with the prior art it is 10 KHz per watt. The frequency resolution with the invention is 30.5 Hz, and with the prior art it is 390 Hz. The dynamic range of the invention is 32 bits, with floating point, and of the prior art it is 16 bits with fixed point.

Figure 8:
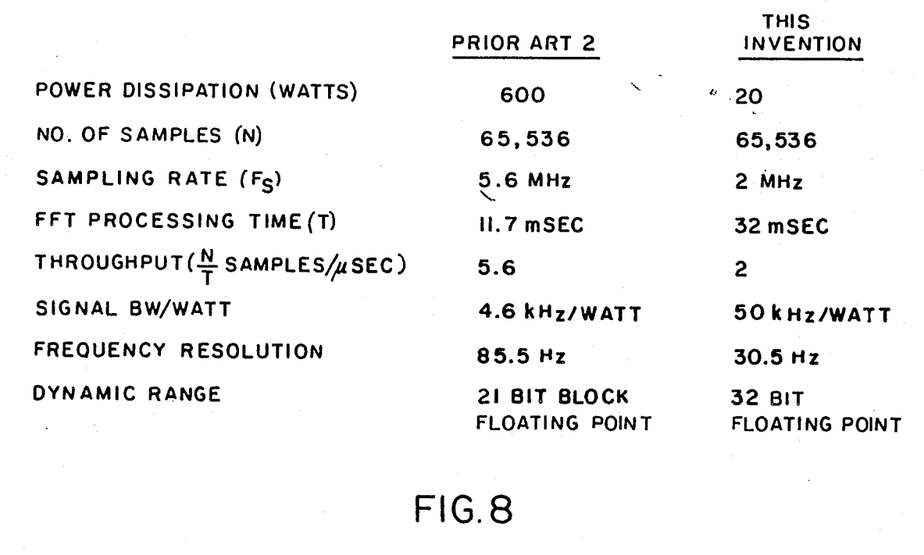
FIG. 8 is a table in which an FFT employing the invention and another FFT of the prior art, which processes the same number of samples, are compared.

In FIG. 8 the invention is compared with another prior art system. In this comparison, the number of samples in the benchmark processor for FFT is equal for the invention and the prior art, at 65,536 samples. The invention FFT processor dissipates 20 watts, and the prior art system 600 watts. Other comparisons of interest shown in FIG. 8 include much finer frequency resolution in the invention. The invention is intended for low-power consumption applications, for example, battery-operated FFT devices such as might be employed in tactical battlefield situations.

I claim:
1. A dual path switch circuit (DPS) for interfacing between arithmetic elements of a Fast Fourier Transform computer, said DPS having two input data channel buses designated herein for reference as A and B, and two output data channel buses C and D, and comprising:

first delay means receiving the input data of channel B for controllably delaying said input data;
first control means for selectably controlling the delay of said first delay means;
first switch means receiving said delayed channel B data and also receiving input data of channel A, dynamically controllable for selecting one or the other of said data and directing it to said channel D bus;
second switch means receiving said delayed channel B data and also receiving input data of channel A, dynamically controllable for selecting one or the other of said data and outputting it;
second delay means receiving the switch output data of said second switch means for controllably delaying said switch output data;
second control means for selectably controlling the delay of said second delay means and for applying the delayed switch output data to said channel C bus;
selector means communicating with said first and second switch means for dynamically selecting either a straight paths switching pattern of said first and second switch means by which said delayed channel B data are connected to said D channel and said channel A input data are connected to said second delay means, or a cross paths switching pattern by which said delayed channel B data are connected to said second delay means and said channel A input data are connected to said D channel.

2. A dual path switch circuit as in claim 1 and wherein said first and second delay means comprise means for delaying by a predetermined number of delay units, and further comprising diagnostic means for testing the DPS that comprises the following elements:
code generator means for generating a code signal;
routing means for routing said code signal through said first and second delay means to produce a test output signal from second delay means;
comparator means for comparing said code signal as generated by said code generator means with said test output signal from said second delay means and outputting indicia of their differences if any.

3. A dual path switch circuit as in claim 2 and wherein said code generator means comprises means for generating a code signal having a plurality of characters, and wherein said number of characters is at least one different from the delay due to said predetermined number of delay units when under diagnostic test.

4. A dual path switch circuit as in claim 3 and wherein said number of characters is one less than the number of delay units due to only one of said first and second delay means.

5. A dual path switch circuit as in claim 2 and further comprising a fault signal means communicating with said comparator means, for producing a fault signal when said indicia of differences indicates a fault, irrespective of the nature of the fault, whereby fault counting can be facilitated.

6. A dual path switch circuit as in claim 1 and wherein:
said first and second delay means comprise means each having a plurality of stages, the utilized number of which affects the number of delay units of said delays; and said first and second control means comprise means for controlling said delays by utilizing less than all of said stages.

7. A dual path switch circuit as in claim 6 and wherein:
each of said stages is settable to a state in which it consumes less power than another of its states;
said DPS further comprises means for setting at least some of the unused ones of said stages to said state of lower power consumption; and,
at least one of said first and second control means comprises means for setting at least some of said unused ones of said stages to said state of lower power consumption.

8. A dual path switch circuit as in claim 6 and further comprising means for producing clock signals for said stages and wherein at least one of said control means for controlling said delays comprises means for blocking clock signals to stages that are not utilized.

9. A dual path switch circuit as in claim 7 and further comprising means for producing clock signals for said stages and wherein at least one of said control means for controlling said delays comprises means for blocking clock signals to stages that are not utilized.

10. A dual path switch circuit as in claim 1 and wherein said first and second control means comprise electrical control means suitable for controlling said delays by electrical signals.

11. Diagnostic apparatus for a dual path switch circuit (DPS), said DPS comprising shift register equipment (SR) that provides N counts of delay between its input and its output; the diagnostic apparatus comprising:
means for providing a test code and outputting at least one test code signal;
connection means communicating with said test code means and said SR for inputting to said SR a test code signal that is output by said test code means;
comparator means having a first input connected with the output of said SR for comparing the output signal of said SR with a signal at a second input of said comparator means;
means for connecting a test code signal from said test code means to said second input of said comparator means;
whereby said comparator means provides an output indicative of errors occurring in the DPS,
and wherein said SR comprises a multiple digit SR for providing N counts of delay to each of said multiple digits in parallel, and wherein said means for connecting said output signal of said SR to said first input of said comparator means comprises means for connecting all of said digits, and said comparator means comprises means for comparing said test code signal with all of said digits.

12. Diagnostic apparatus as in claim 11 and wherein said test code means comprises means for providing a test code signal having a sequence whose number of characters is K, and wherein K differs from N by at least one, at least when the DPS is under diagnostic test.

13. Diagnostic apparatus as in claim 12 and wherein K is one less than N.

14. Diagnostic apparatus as in claim 13 and wherein K is 31 and N is 32.

15. Diagnostic apparatus as in claim 14 and wherein said test code signal is 11100, 10001, 01011, 11011, 01001, 10000, 1.

* * * * *